(12) United States Patent
Yeo

(10) Patent No.: US 11,792,963 B2
(45) Date of Patent: Oct. 17, 2023

(54) COOLING APPARATUS

(71) Applicant: Hanon Systems, Daejeon (KR)

(72) Inventor: Ji Won Yeo, Daejeon (KR)

(*) Notice: Subject to any disclaimer, the term of this patent is extended or adjusted under 35 U.S.C. 154(b) by 199 days.

(21) Appl. No.: 17/052,414

(22) PCT Filed: May 14, 2019

(86) PCT No.: PCT/KR2019/005759
§ 371 (c)(1),
(2) Date: Nov. 2, 2020

(87) PCT Pub. No.: WO2019/221474
PCT Pub. Date: Nov. 21, 2019

(65) Prior Publication Data
US 2021/0235601 A1    Jul. 29, 2021

(30) Foreign Application Priority Data

May 16, 2018 (KR) .................. 10-2018-0056208
Apr. 25, 2019 (KR) .................. 10-2019-0048317

(51) Int. Cl.
*H05K 7/20* (2006.01)
(52) U.S. Cl.
CPC .................. *H05K 7/20881* (2013.01)
(58) Field of Classification Search
CPC .................. H05K 7/20881; H05K 7/20309
See application file for complete search history.

(56) References Cited

U.S. PATENT DOCUMENTS

| 3,524,497 A * | 8/1970 | Chu ............... H01L 23/473 |
| | | 165/80.4 |
| 6,994,151 B2 * | 2/2006 | Zhou .............. H01L 23/427 |
| | | 165/104.21 |
| 7,007,506 B2 * | 3/2006 | Kubo .............. H05K 7/20309 |
| | | 165/80.4 |
| 2008/0030956 A1 | 2/2008 | Silverstein et al. |
| 2010/0132923 A1 | 6/2010 | Batty et al. |
| 2011/0220327 A1 * | 9/2011 | Yoshihara ........ H01L 23/427 |
| | | 165/104.21 |
| 2012/0111553 A1 | 5/2012 | Tsoi et al. |
| 2018/0031330 A1 | 2/2018 | Roberts et al. |

FOREIGN PATENT DOCUMENTS

JP     2014127539 A     7/2014

* cited by examiner

*Primary Examiner* — Devon Russell
(74) *Attorney, Agent, or Firm* — Norton Rose Fulbright US LLP; James R. Crawford

(57) ABSTRACT

Provided is a cooling apparatus including a vaporization unit in which a working fluid evaporates due to a heat source, and a condensation unit in which the evaporated working fluid is condensed, wherein the vaporization unit is divided into a first moving space and a second moving space by a partition wall, a first moving passage connecting the first moving space and the second moving space is formed in one region of the partition wall, and the working fluid introduced through the first moving space moves to the second moving space through the first moving passage to exchange heat.

17 Claims, 12 Drawing Sheets

(a)  (b)  (c)

(a)

(b)

COOLING APPARATUS

This application is a national phase under 35 U.S.C. § 371 of International Application No. PCT/KR2019/005759 filed May 14 2019, which claims the benefit of priority from Korean Patent Application Nos. 10-2018-0056208 filed May 16, 2018 and 10-2019-0048317 filed Apr. 25, 2019. The entire contents of these applications are incorporated herein by reference in their entirety.

TECHNICAL FIELD

The present invention relates to a cooling apparatus. More specifically, the present invention relates to a cooling apparatus configured to cool heat locally generated in a sensor, a controller, and the like used in machinery.

BACKGROUND ART

Recently, as a part of countermeasures against environmental problems, development of hybrid vehicles, fuel cell vehicles, and electric vehicles using driving power of motors has received more attention.

Generally, the above-described vehicles necessarily include an electronic element configured to control a hybrid starter generator (HSG) and an electronic element configured to control the motor, and since such electronic elements are heated when electricity is supplied to drive the electronic elements, the electronic elements necessarily need cooling units.

As a technology related thereto, in Japanese Patent Publication No. 2001-245478 (Disclosed: Sep. 7, 2001, Title: INVERTER COOLING APPARATUS), an inverter using a semiconductor module including semiconductor elements such as an insulated-gate bipolar transistor (IGBT) and diodes is disclosed, and in Japanese Patent Publication No. 2008-294283 (Disclosed: Dec. 4, 2008, Title: SEMICONDUCTOR APPARATUS), a heat sink, which is installed to be in contact with a lower surface of a semiconductor element and in which a fluid flows to exchange heat, is disclosed.

Referring to FIG. 1, conventionally, a refrigerant is transferred through a pipeline 1 and heat is exchanged between the refrigerant and electronic elements e to cool the electronic elements e provided in an engine room of a vehicle.

However, since such a conventional cooling method for electronic elements requires the pipeline 1 for transferring the refrigerant to the electronic elements e and a pump p configured to generate power for moving the refrigerant along the pipeline 1, there are problems in that a structure of the engine room is formed to be complex and additional power for driving the pump is required.

In addition, due to automatic driving recently being in the spotlight, additional heat is generated from electronic elements for sensors and image processing devices required for the automatic driving. In a case in which the above-described conventional method is used as a cooling method of cooling the heat, there are problems in that a long pipeline is needed, and an inner spatial situation may become worse, and in a case in which a heat pipe commercially manufactured for an electronic element cooling method for a personal computer (PC) is applied, since material corrosion problems may be raised, there is a problem in that the heat pipe is not suitable for a vehicle which should have durability.

Therefore, a new cooling apparatus capable of solving the disadvantages of the conventional cooling apparatus is required.

Technical Problem

The present invention is directed to providing a cooling apparatus which is directly attached to a member that generates heat and uses a method of cooling a circulating refrigerant without a pump.

In addition, a structure of a vaporization unit is divided as a multilayer structure to improve a heat absorption effect.

Objectives to be solved through the present invention are not limited to the above-described objective, and other objectives which are not mentioned above will be clearly understood by those skilled in the art through the following specification.

Technical Solution

One aspect of the present invention provides a cooling apparatus including a condensation unit which cools a working fluid, a vaporization unit to which the working fluid moves and in which the working fluid exchanges heat, a first pipe through which the working fluid moves from the condensation unit to the vaporization unit, a second pipe through which the working fluid evaporated in the vaporization unit moves to the condensation unit, wherein the vaporization unit is divided into a first moving space and a second moving space by a partition wall, a first moving passage connecting the first moving space and the second moving space is formed in one region of the partition wall, and the working fluid introduced through the first moving space moves to the second moving space through the first moving passage to exchange heat.

The first moving passage may be formed under the partition wall.

The vaporization unit may include a main body portion divided into the first moving space and the second moving space by the partition wall, a first outer wall sealing the first moving space, and a second outer wall sealing the second moving space.

A plurality of protrusions may be formed on the partition wall of the second moving space to increase a heat exchange area.

A plurality of protrusions may be formed on the second outer wall sealing the second moving space.

The protrusion may be in surface contact with the second outer wall.

The protrusion may perpendicularly protrude from the partition wall.

The protrusion may have a quadrilateral column shape.

A second moving passage may be provided above the second moving space, and the second moving passage may be blocked from the first moving space by a partition portion.

An inlet portion recessed inward may be disposed at an upper side of a first inner wall of the first moving space, the inlet portion may be connected to the first pipe, and the working fluid may be introduced through the inlet portion.

A third moving passage connecting the second moving passage and the first moving space may be disposed at an upper side of a second inner wall facing a first inner wall of the first moving space.

A guide portion which guides bubbles introduced through the first moving passage to the third moving passage may be disposed in the first moving space.

The guide portion may be obliquely disposed to be spaced apart from the first inner wall and the second inner wall.

The guide portion may be connected to the partition wall through a curved surface.

Both of the first pipe and the second pipe may be connected to the first outer wall.

The first pipe may be connected to a lower portion of the condensation unit, and the second pipe may be connected to an upper portion of the condensation unit.

A protruding step may be formed in one region of the partition portion.

The plurality of protrusions may have different heights.

The height of the protrusion may proportionally decrease in a direction from the first moving passage to the second moving passage.

Another aspect of the present invention provides a cooling apparatus including a vaporization unit in which a working fluid evaporates due to a heat source; and a condensation unit in which the evaporated working fluid is condensed, wherein the vaporization unit is divided into a first moving space and a second moving space by a partition wall, a first moving passage connecting the first moving space and the second moving space is formed in one region of the partition wall, at least one flow guide is disposed in the first moving space, and the working fluid introduced through the first moving space moves to the second moving space through the first moving passage to exchange heat.

The flow guide may be provided as a plurality of flow guides, and a height of the flow guide may decrease in a direction away from an inlet portion thorough which the working fluid is introduced from the vaporization unit.

An upper portion of the flow guide may be formed to have a curved surface.

The flow guide may include a section in which a width of the flow guide increases in a direction from an upper portion toward a lower portion of the flow guide.

At least one interval among intervals between the adjacent flow guides may be disposed to be different from the remaining intervals.

An outermost interval among the intervals between the adjacent flow guides may be disposed to be greater than the other intervals.

A plurality of protrusions may be formed on the partition wall of the second moving space to increase a heat exchange area.

An inlet portion recessed inward may be disposed in the first moving space, and the inlet portion may include an inclined surface formed toward the first moving passage.

At least one auxiliary moving passage may be provided on the partition wall.

The auxiliary moving passage may be provided as a pair and disposed on outer sides of the first moving passage.

Advantageous Effects

According to embodiments, since a cooling apparatus is attached to one side of an electronic element, cooling efficiency of the electronic element can be improved.

In addition, there is an effect of preventing drying-out occurring due to a lack of a working fluid.

In addition, there is an effect of improving cooling efficiency by transferring excessive heat, which is not cooled due to a boiling effect of a heating surface, to another layer.

In addition, since the working fluid passes through a front surface before being introduced into a heating surface (rear surface), the working fluid can uniformly flow, an undercooling degree of the working fluid can be reduced due to heat transfer through heat conduction, and thus a cooling effect can be improved.

In addition, since a space through which gas can escape is provided, there is an effect of preventing performance degradation occurring due to bubble accumulation on a heating area.

In addition, since the working fluid is uniformly distributed using a flow guide, a heat exchange effect can be improved.

Various useful advantages and effects of the present invention are not limited to the above-described contents and will be more easily understood in the detailed description of embodiments of the present invention.

MODES OF THE INVENTION

Figure 1:
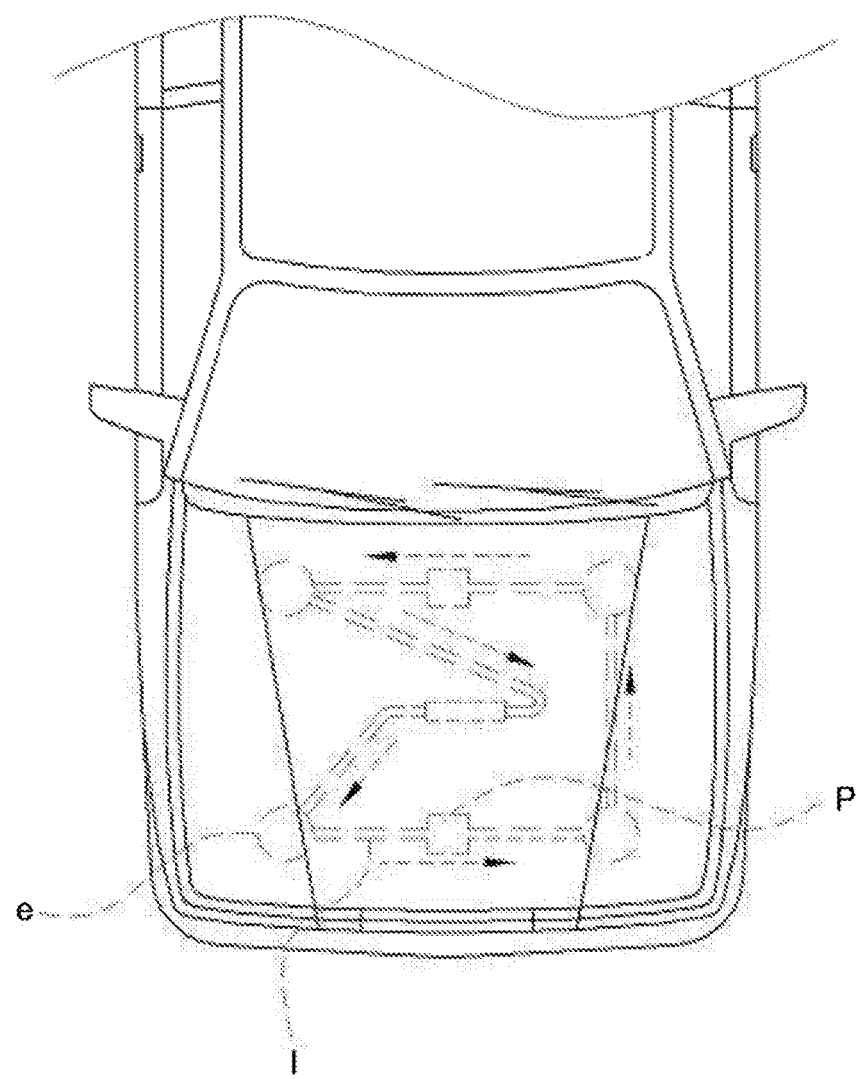
FIG. 1 is a view illustrating a conventional structure for cooling electronic elements provided in an engine room of a vehicle.

Hereinafter, exemplary embodiments of the present disclosure will be described with reference to the accompanying drawings in detail.

However, the technical spirit of the present invention is not limited to some embodiments which will be described and may be realized using various other embodiments, and at least one component of the embodiments may be selectively coupled, substituted, and used to realize the technical spirit within the range of the technical spirit.

In addition, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted in consideration of contextual meanings of the related technology.

In addition, the terms used in the embodiments of the present invention are considered in a descriptive sense and not to limit the present invention.

In the present specification, unless clearly indicated otherwise by the context, singular forms include the plural forms thereof, and in a case in which "at least one (or one or more) among A, B, and C" is described, this may include one or more combinations among all combinations which can be combined with A, B, and C.

In descriptions of components of the present invention, terms such as "first," "second," "A," "B," "(a)," and "(b)" can be used.

The terms are only to distinguish one element from another element, and an essence, order, and the like of the element are not limited by the terms.

It should be understood that, when an element is referred to as being "connected or coupled" to another element, such a description may include both a case in which the element is directly connected or coupled to another element, and a case in which the element is connected or coupled to another element by still another element disposed therebetween.

In a case in which any one element is described as being formed or disposed "on or under" another element, such a description includes both a case in which the two elements are formed or disposed to be in direct contact with each other and a case in which one or more other elements are interposed between the two elements. In addition, when one element is described as being formed "on or under" another element, such a description may include a case in which the one element is formed at an upper side or a lower side with respect to another element.

Hereinafter, in the detailed description of the example embodiments of the invention with reference to the accompanying drawings, components that are the same or correspond to each other will be denoted by the same reference numerals regardless of the figure numbers, and redundant descriptions will be omitted.

In FIGS. 1 to 12, only main parts are clearly illustrated to clearly and conceptually understand the present invention, and as a result, various modifications of the drawings are expected, and thus the scope of the present invention does not need to be limited to specific shapes of the illustrated drawings.

Figure 2:
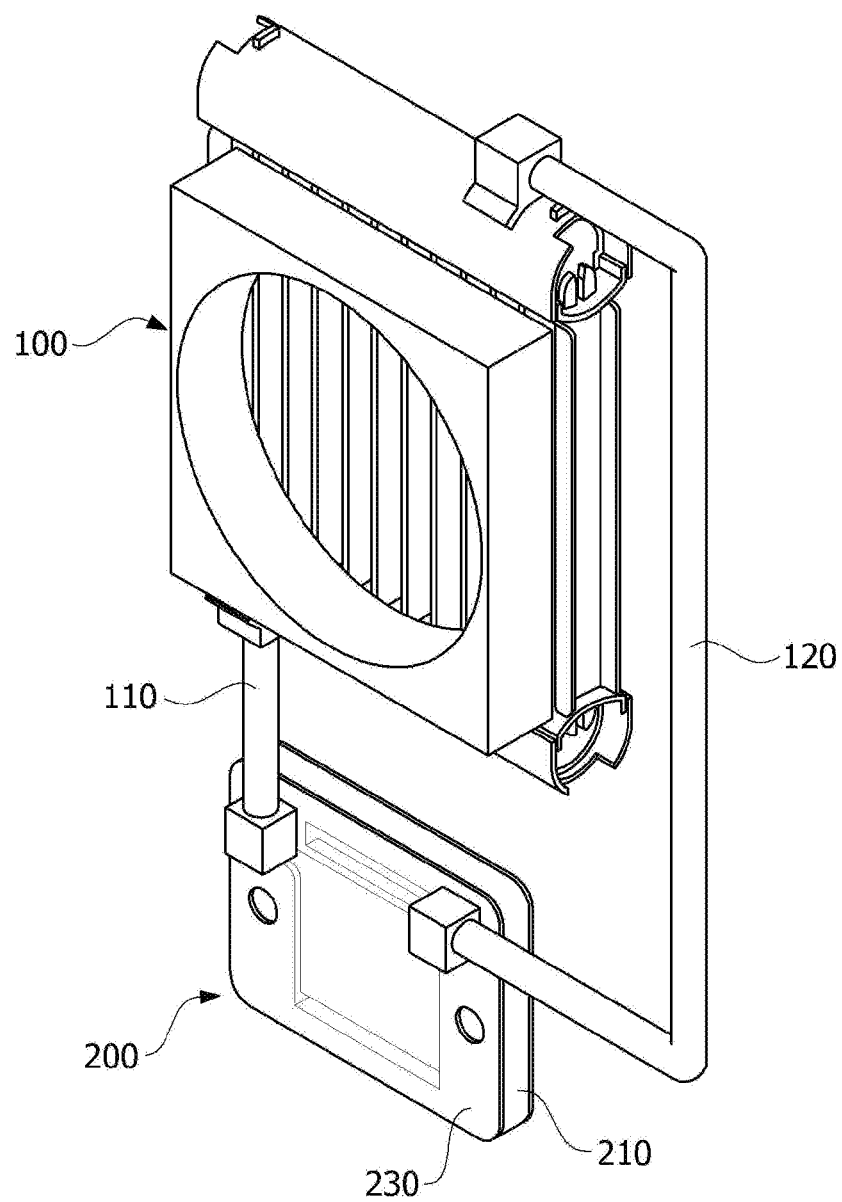
FIG. 2 is a front perspective view illustrating a cooling apparatus according to an embodiment of the present invention.
Figure 3:
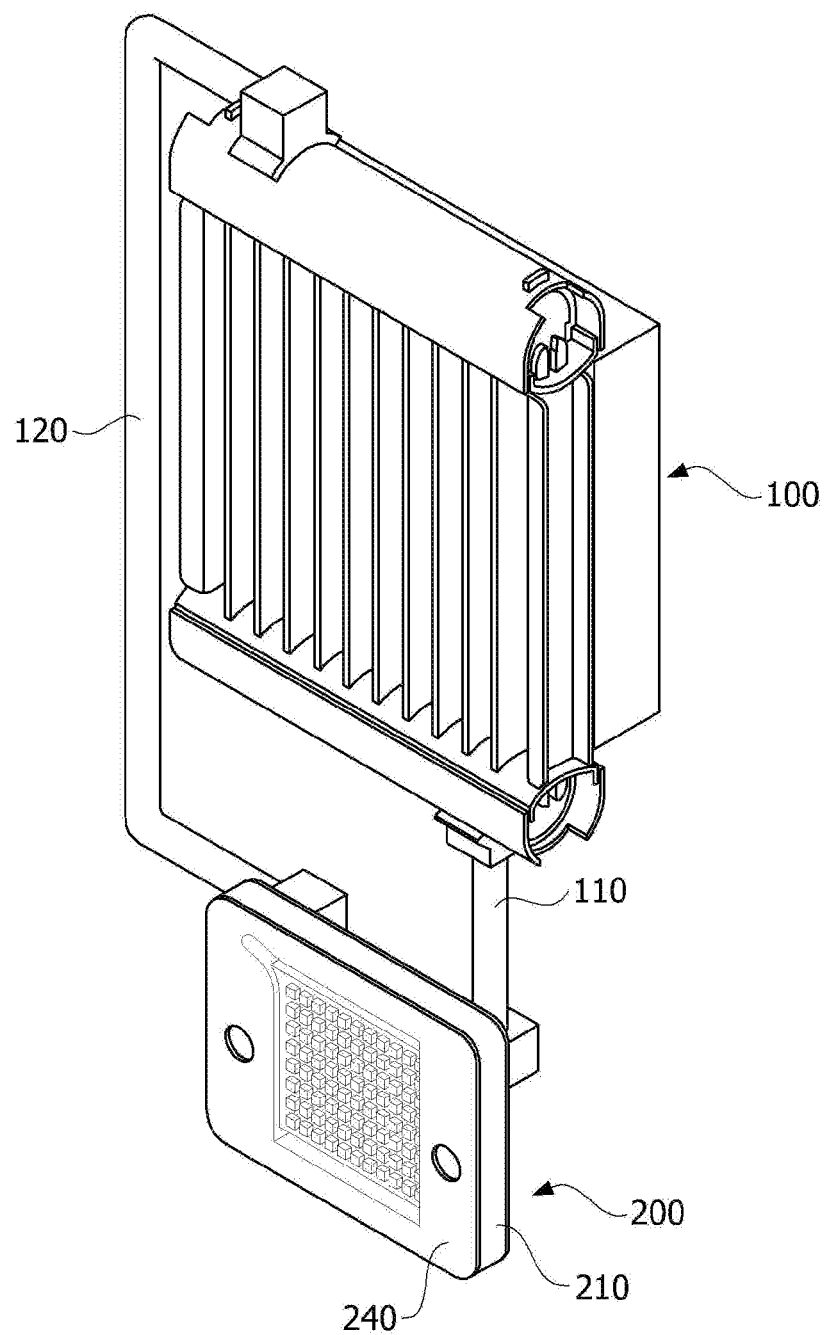
FIG. 3 is a rear perspective view illustrating the cooling apparatus according to the embodiment of the present invention.

FIG. 2 is a front perspective view illustrating a cooling apparatus according to an embodiment of the present invention, and FIG. 3 is a rear perspective view illustrating the cooling apparatus according to the embodiment of the present invention.

Referring to FIGS. 2 and 3, a cooling apparatus 1 according to the embodiment of the present invention may include a condensation unit 100, a vaporization unit 200, a first pipe 110, and a second pipe 120.

The condensation unit 100 may cool a working fluid and supply the working fluid to the vaporization unit 200. The condensation unit 100 may cool the working fluid of which heat is exchanged and which is evaporated in the vaporization unit 200 and may supply the working fluid to the vaporization unit 200. A cooling method of the condensation unit 100 is not limited, and various methods such as a natural cooling method or a forced cooling method may be used.

The vaporization unit 200 receives the working fluid from the condensation unit 100, and the working fluid may circulate in the vaporization unit 200. The vaporization unit 200 may be in contact with a heat source such as a semiconductor device, a diode, a transistor, a resistor, and a capacitor which generates heat and is used in an electric device, that is, an electronic element. Such an electronic element generally has a problem in that performance is degraded or the electronic element does not operate in a case in which a temperature thereof increases to a temperature greater than or equal to a predetermined temperature.

Since the vaporization unit 200 of the present invention is connected to the electronic element and exchanges heat thereof with the electronic element, performance degradation of the electronic element is prevented, and since the electronic element generates heat, the working fluid is boiled so that the working fluid enters a gas state.

The vaporization unit 200 may be formed of a metal material to facilitate heat exchange. As an embodiment, the vaporization unit 200 may be formed of aluminum but is not limited thereto and may be formed of any one of various materials having high heat conductivity.

In addition, the vaporization unit 200 may be provided as a multilayer structure including a first outer wall 230, a second outer wall 240, and a main body portion 210 disposed between the first outer wall 230 and the second outer wall 240. The multilayer structure is for the sake of convenience in manufacturing, and the number of layers or a connection structure is not limited. The structure of the vaporization unit 200 will be further described below.

In the first pipe 110, the working fluid may move from the condensation unit 100 to the vaporization unit 200. A shape of the first pipe 110 is not limited and may be variously changed. As an embodiment, the first pipe 110 may be connected to a lower portion of the condensation unit 100, and the working fluid may be supplied to the vaporization unit 200 due to gravity.

In the second pipe 120, the working fluid evaporated in the vaporization unit 200 may move to the condensation unit 100. The second pipe 120 may be connected to an upper portion of the condensation unit 100. The evaporated working fluid is introduced into the upper portion of the condensation unit 100 and is cooled therein, and the liquefied working fluid may automatically move toward the first pipe 110 positioned under the condensation unit 100 due to gravity.

Both of the first pipe 110 and the second pipe 120 may be connected to one side of the first outer wall 230 or the second outer wall 240. This is to facilitate connection of the cooling apparatus 1 and the electronic element.

The first pipe 110 and the second pipe 120 refer to passages connecting the vaporization unit 200 and the condensation unit 100, and shapes or structures thereof may be variously changed.

Figure 4:
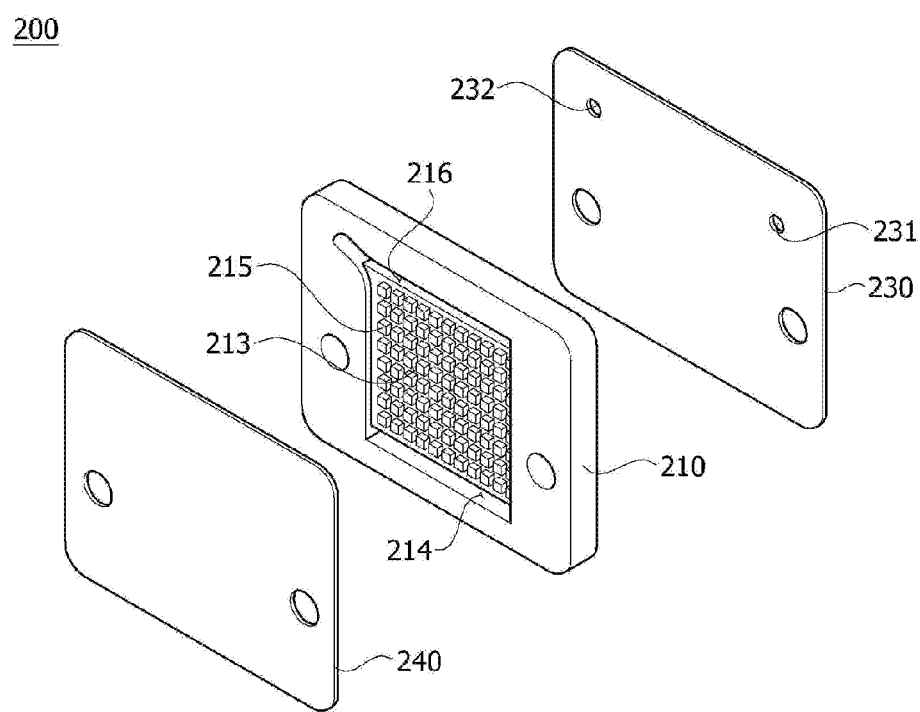
FIG. 4 is an exploded perspective view illustrating a vaporization unit, which is a component of the present invention, when viewed from behind.
Figure 5:
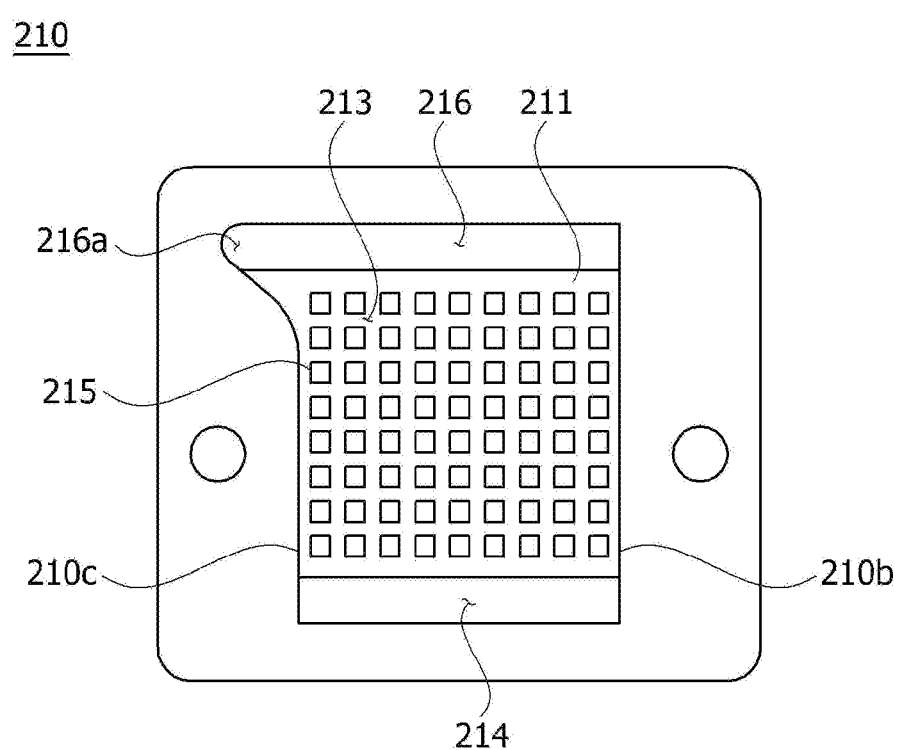
FIG. 5 is a view illustrating a rear surface of a main body portion which is a component of FIG. 4.
Figure 6:
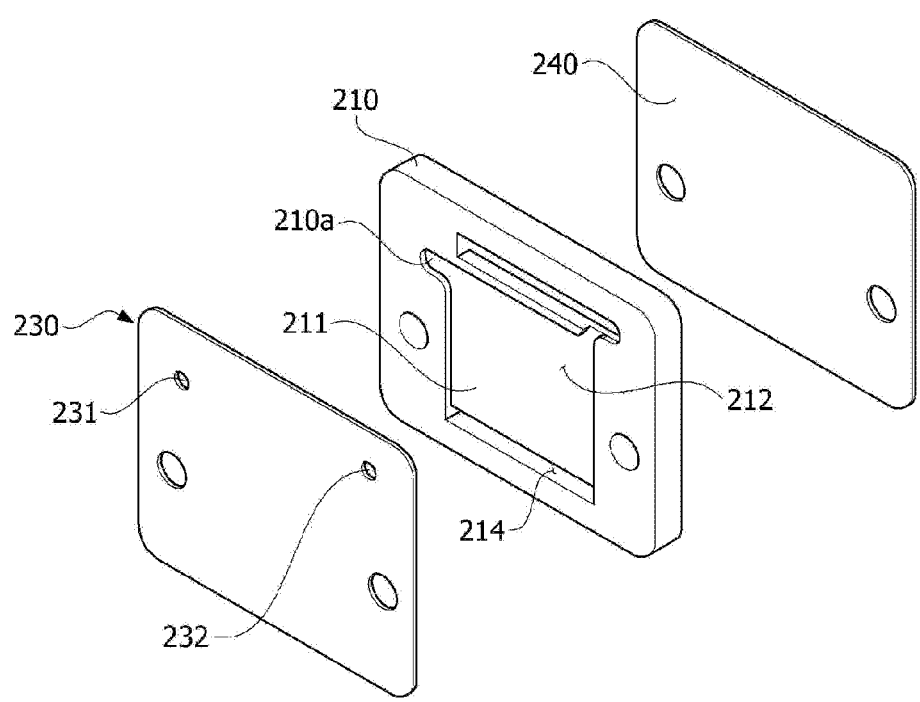
FIG. 6 is an exploded perspective view illustrating the vaporization unit, which is the component of the present invention, when viewed from front.
Figure 7:
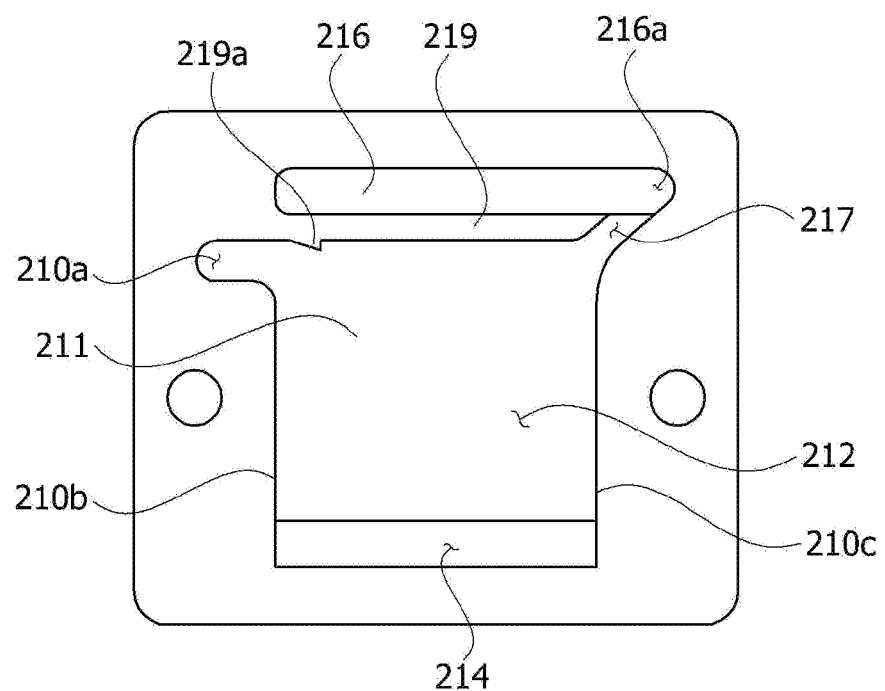
FIG. 7 is a view illustrating a front surface of the main body portion which is a component of FIG. 6.

FIG. 4 is an exploded perspective view illustrating the vaporization unit 200, which is a component of the present invention, when viewed from behind, and FIG. 5 is a view illustrating a rear surface of the main body portion 210 which is a component of FIG. 4. FIG. 6 is an exploded perspective view illustrating the vaporization unit 200, which is the component of the present invention, when viewed from front, and FIG. 7 is a view illustrating a front surface of the main body portion 210 which is a component of FIG. 6.

Referring to FIGS. 4 to 7, the vaporization unit 200 may include the main body portion 210 divided into a first moving space 212 and a second moving space 213, in which the working fluid moves, by a partition wall 211, the first outer wall 230 connected to a front surface of the first moving space 212 to seal the first moving space 212 and the second outer wall 240 connected to a front surface of the second moving space 213 to seal the second moving space 213.

The main body portion 210 may be divided into the first moving space 212 and the second moving space 213, in which the working fluid may move, by the partition wall 211, and a first moving passage 214 connecting the first moving space 212 and the second moving space 213 may be formed under the partition wall 211.

The working fluid introduced into the first moving space 212 descends downward due to gravity, and the descended working fluid may move to the second moving space 213 through the first moving passage 214. The working fluid moved to the second moving space 213 may exchange heat with the electronic element connected to the second outer wall 240 and evaporate to move to the condensation unit.

As an embodiment, the first moving space 212 may be formed using the partition wall 211 and a first inner wall 210b and a second inner wall 210c which are disposed on both sides of the partition wall 211, and the first moving passage 214 may be formed under the partition wall 211 to have a long narrow shape in a lateral direction. An inlet portion 210a recessed inward may be disposed at an upper side of the first inner wall 210b, and the working fluid supplied from the condensation unit 100 may be introduced through the inlet portion 210a.

Due to the first moving passage 214 provided to have the long narrow shape, the working fluid supplied through the inlet portion 210a may be supplied to an entirety of the second moving space 213. The first moving passage 214 may improve cooling efficiency by allowing the working fluid to be supplied to the entirety of the second moving space 213 without allowing the working fluid to be mainly supplied to one side thereof in a case in which the working fluid is heated in the second moving space 213.

The second moving space 213 may be divided by the partition wall 211, a second moving passage 216 may be formed above the partition wall 211, and the first moving passage 214 connected to the first moving space 212 may be formed under the partition wall 211.

In the second moving passage 216, the working fluid introduced into the second moving space 213 may be heated and boiled, and the vaporized working fluid may move.

An outlet portion 216a recessed inward from the second inner wall 210c may be formed at one side of the second moving passage 216, and the working fluid moved to the second moving passage 216 may be discharged through the outlet portion 216a to move to the condensation unit 100.

The second moving passage 216 may pass through the partition wall 211 but may be blocked from the first moving space 212 by a partition portion 219 provided on the first moving space 212. This is to prevent gas from entering the inlet portion 210a.

A third moving passage 217 connecting the first moving space 212 and the second moving passage 216 may be formed in one region of the partition portion 219. As an embodiment, the third moving passage 217 may be formed at an upper side of the second inner wall 210c of the first moving space 212. Bubbles generated in the first moving space 212 or bubbles generated in the second moving space 213 may move to the second moving passage 216 through the third moving passage 217 in a case in which the bubbles enter the first moving passage 214.

The partition portion 219 may be obliquely disposed to prevent the bubbles generated due to the working fluid being heated from entering the inlet portion 210a, and a protruding step 219a may be formed on one region of the partition portion 219 to prevent the bubbles from entering the inlet portion 210a.

In addition, the second moving passage 216 may be disposed above the inlet portion 210a. This is to prevent gas which is evaporated and ascends in the second moving space 213 from flowing into the inlet portion 210a.

A plurality of protrusions 215 may be formed on any one of the partition wall 211 or the second outer wall 240 forming the second moving space 213 to face the second moving space 213. The plurality of protrusions 215 are directed to improving heat conduction efficiency when heat generated from the electronic element in contact with the second outer wall 240 is transferred to the working fluid. In the drawings, the protrusions 215 protrude from the partition wall 211 but are not limited thereto and may be disposed to protrude from the second outer wall 240 to face the second moving space 213.

The partition wall 211 partitions the first moving space 212 from the second moving space 213, and the working fluid heated in the second moving space 213 transfers heat to the working fluid positioned in the first moving space 212 through the partition wall 211.

This may improve performance of the vaporization unit 200 because the working fluid, of which an amount of heat is increased due to being boiled, of the second moving space 213 transfers the heat to the working fluid present in the first moving space 212 through the partition wall 211 so that heat is diffused in the second moving space 213 and an under cooling degree of the working fluid of the first moving space 212 may be reduced.

The protrusion 215 may be in surface contact with the second outer wall 240. This can improve efficiency of transferring heat of the electronic element in contact with the second outer wall 240 to the working fluid.

The protrusion 215 may perpendicularly protrude from the partition wall 211. As an embodiment, the protrusion 215 may be formed to have a quadrilateral column shape. An upper surface of the quadrilateral column shaped protrusion 215 may be in contact with the second outer wall 240 so that heat generated from the electronic element may be transferred to the protrusion 215, and a sidewall of a quadrilateral column may transfer the heat to the working fluid.

Due to the protrusion 215 perpendicularly protruding from the partition wall 211, a surface tension of the working fluid is generated at a part thereof so that the working fluid may easily stay.

In addition, bubbles are generated in a region, in which the sidewall is in contact with the partition wall 211, of the sidewall, which is perpendicularly formed, due to boiling, and the bubbles generated in the sidewall perpendicularly connected to the partition wall 211 may easily escape from the sidewall.

In addition, the plurality of protrusions 215 may improve a degree of freedom of the bubbles and delay drying-out occurring due to gas movement.

In addition, the plurality of protrusions 215 may have different heights. As an embodiment, the heights of the plurality of protrusions 215 may be proportionally decreased in a direction from the first moving passage 214 to the second moving passage 216, and this may improve cooling performance due to a liquid film of the working fluid or by facilitating movement of the bubbles of which sizes are increased.

The plurality of provided protrusions 215 may be disposed at predetermined intervals so as to uniformly heat an entirety of the working fluid. Accordingly, differential heating by heat transferred from the electronic element can be prevented.

The first outer wall 230 may be coupled to the front surface of the first moving space 212 to seal the first moving space 212. A first connection hole 231 and a second connection hole 232 may be formed in the first outer wall 230.

The first connection hole 231 may be disposed in a front surface of the inlet portion 210a disposed in the first moving space 212 and may be connected to an end portion of one side of the first pipe 110. The working fluid in a liquid state introduced through the first connection hole 231 may move to the first moving space 212.

The second connection hole 232 may be disposed in a front surface of the outlet portion 216a disposed in the second moving passage 216 of the second moving space 213. In a case in which the working fluid moves from the first moving space 212 to the second moving space 213, the second connection hole 232 may serve as a passage through which the working fluid boiled and vaporized by receiving heat of the electronic element moves. The working fluid in a gas state introduced through the second connection hole 232 may move to the condensation unit 100 through the second pipe 120.

The second outer wall 240 may be coupled to the front surface of the second moving space 213 to seal the second moving space 213. The second outer wall 240 is in contact with the electronic element to transfer heat to the working fluid, and a shape of the second outer wall 240 may be variously changed to be pressed against a shape of the electronic element.

Figure 8:
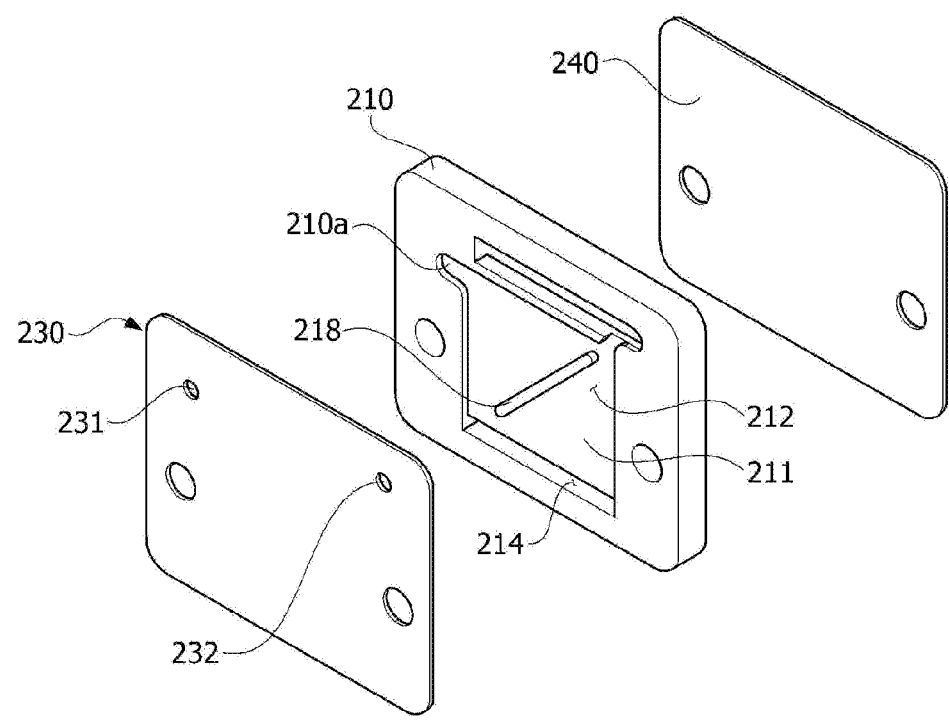
FIG. 8 is an exploded perspective view illustrating a vaporization unit which is a component of the present invention according to one embodiment.
Figure 9:
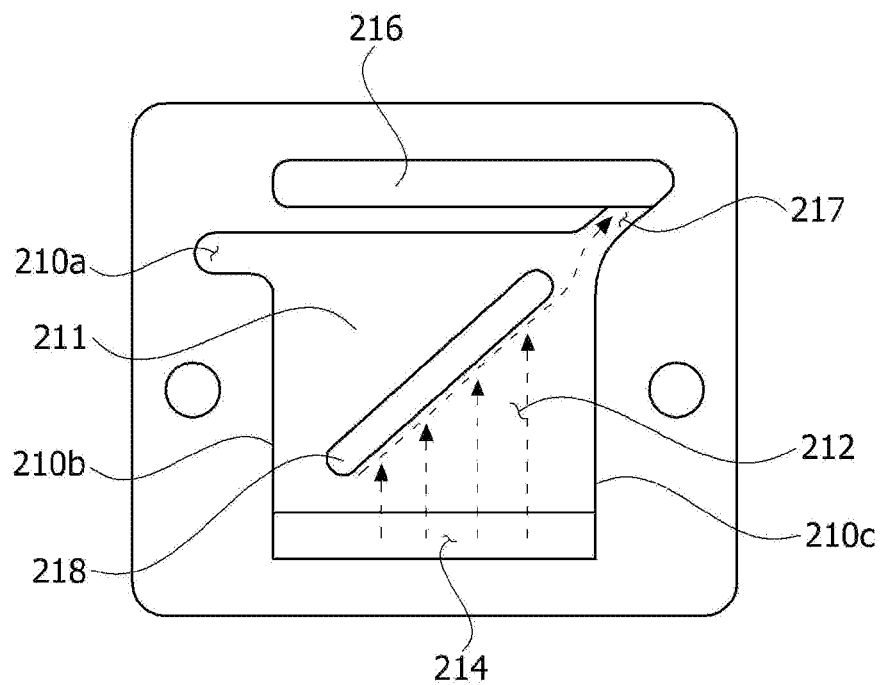
FIG. 9 is a view illustrating a front surface of a main body portion which is the component of FIG. 8.

FIG. 8 is an exploded perspective view illustrating a vaporization unit 200 which is a component of the present invention according to one embodiment, and FIG. 9 is a view illustrating a front surface of a main body portion 210 which is the component of FIG. 8.

Referring to FIGS. 8 and 9, a vaporization unit 200, which is the component of the present invention, may include a guide portion 218 according to one embodiment.

The guide portion 218 may be obliquely disposed in a first moving space 212 to guide bubbles introduced through a first moving passage 214 to a third moving passage 217. The guide portion 218 may be disposed to be spaced apart from a first inner wall 210b and a second inner wall 210c. This is for supplying a working fluid into the first moving space 212 through a spaced passage between the first inner wall 210b and an end portion of one side of the guide portion 218. In addition, bubbles of the working fluid introduced into the first moving passage 214 may move to an outlet portion 216a through a spaced passage between the second inner wall 210c and an end portion of the other side of the guide portion 218.

As an embodiment, the guide portion 218 may be formed to have a protruding rod shape, and the guide portion 218 may be connected to a partition wall 211 through a curved surface thereof. This is to prevent the working fluid from evaporating on the guide portion 218. A shape of the curved surface is not limited, and the guide portion 218 may be connected to the partition wall 211 in various manners.

Figure 10:
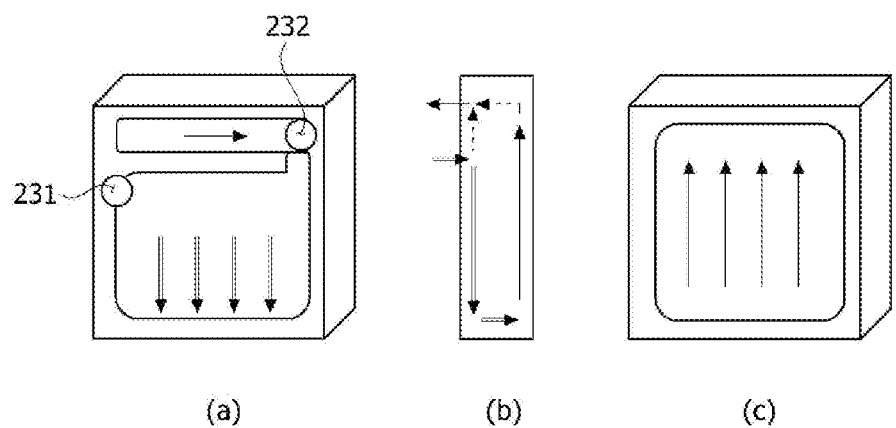
FIG. 10 is a set of views for describing a cooling flow of a working fluid of the present invention.

FIG. 10 is a set of views for describing a cooling flow of the working fluid of the present invention. FIG. 10A is a view illustrating a flow of the working fluid in the first moving space 212 of the vaporization unit 200, FIG. 10B is a view illustrating the flow of the working fluid when viewed from a side surface of the vaporization unit 200, and FIG. 10C is a view illustrating the flow of the working fluid in a second moving space 213 of the vaporization unit 200.

Referring to FIG. 10, the working fluid introduced through an inlet portion 210a moves downward in the first moving space 212 and moves to a second moving passage 216 through the first moving passage 214.

The working fluid introduced into the second moving space 213 starts to be heated in a lower portion of the second moving space 213 and moves upward, and the working fluid vaporizes and ascends due to boiling while moving. The ascended gas moves from the second moving passage 216 to the outlet portion 216a and exchanges heat while moving to a condensation unit 100 through a second pipe 120.

In addition, bubbles introduced into the first moving space 212 from the second moving space 213 though the first moving passage 214 move to the outlet portion 216a through the guide portion 218.

Figure 11:
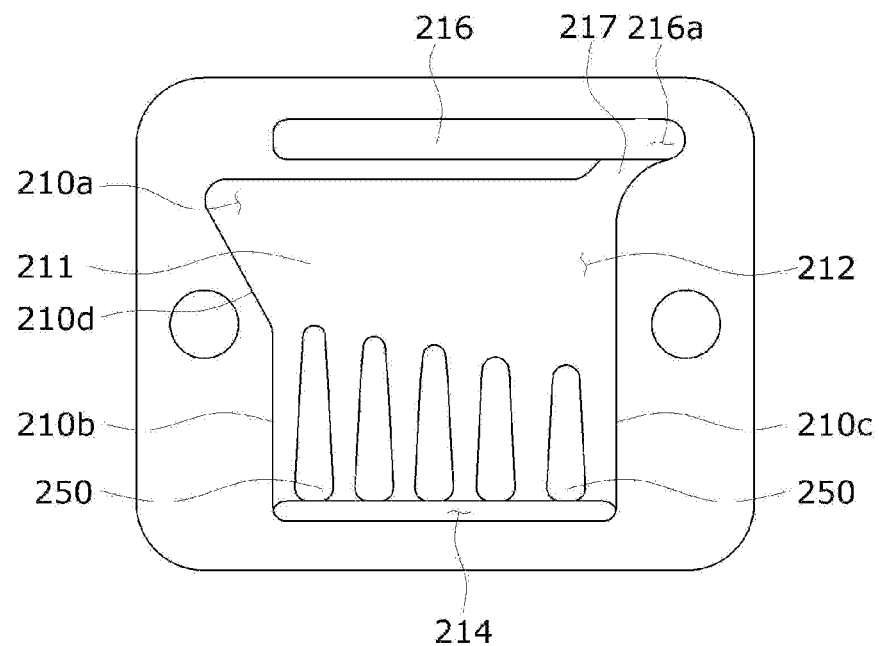
FIG. 11 is a view illustrating a vaporization unit of FIG. 6 according to another embodiment.

FIG. 11 is a view illustrating a vaporization unit of FIG. 6 according to another embodiment.

Referring to FIG. 11, an inlet portion 210a recessed inward may be disposed in a first moving space 212 of a vaporization unit 200 which is a component of the present invention, and one or more flow guides 250 may be disposed in the first moving space 212.

The inlet portion 210a may be a space into which a working fluid supplied from a condensation unit is introduced and may be provided as a structure recessed inward of the first moving space 212.

As an embodiment, the inlet portion 210a may include an inclined surface 210d formed toward a first moving passage 214. The inclined surface 210d may be disposed on a lower sidewall forming the inlet portion 210a and formed such that a width of the inlet portion 210a increases in a direction from an inner side toward an outer side.

The inclined surface 210d may secure a spread angle of the working fluid introduced from a condensation unit 100 to determine movement of the working fluid before the working fluid moves to the flow guides 250. In this case, even when a flow speed of the working fluid decreases, a degree of freedom may increase.

In addition, the inclined surface 210d may improve heat exchange performance by uniformly distributing the working fluid to an entirety of the first moving space 212.

The flow guides 250 may be disposed on a partition wall 211 to protrude in the first moving space 212 and may guide movement of the working fluid.

The plurality of flow guides 250 may be provided, and a height thereof may be provided to decrease in a direction away from the inlet portion 210a. This may easily introduce the working fluid moving along the inclined surface 210d. As an embodiment, the heights of the flow guides 250 may be decreased by a predetermined ratio but are not limited thereto and may be variously changed according to distances between the flow guides 250 or a speed of the working fluid.

The plurality of provided flow guides 250 may be disposed at predetermined intervals to prevent the working fluid from mainly flowing to one side thereof and may transfer heat generated in a second moving space 213 to the first moving space 212.

In addition, the plurality of disposed flow guides 250 may maintain a predetermined amount of working fluid in a corresponding space to supply the working fluid to the second moving space 213 even in a situation in which a cooling apparatus is obliquely attached thereto or a posture of the cooling apparatus is instantaneously inclined and may transfer heat transferred through the protrusions 215 in the second moving space 213 to the working fluid moving in the first moving space 212 to increase a heat transfer area so that cooling efficiency can be improved.

An upper portion of the flow guide 250 may be formed to have a curved surface. This may offset flow resistance when the working fluid comes into contact with the flow guides 250 and reduce generation of a whirlpool so that performance degradation can be prevented. A shape of the curved surface of the flow guide 250 is not limited and may have any one of various curvatures.

The flow guide 250 may have a section in which a width increases in a direction from the upper portion toward a lower portion thereof.

As an embodiment, since a side surface of the flow guide 250 is obliquely provided, the flow guide 250 may have the section in which the width increases in a direction from the upper portion toward the lower portion, and an end portion of the flow guide 250 may be disposed to be in contact with the first moving passage 214.

As the width of the flow guide 250 increases, an interval between the adjacent flow guides 250 among the plurality of disposed flow guides 250 decreases. Such an interval control may cause the working fluid to normally circulate, and, when a temperature of the working fluid is low or an amount of heating is small, the working fluid flows at a low speed in the second moving space 213 due to a high surface tension so that heat exchange efficiency can be improved in the second moving space 213.

Conversely, in a case in which the temperature of the working fluid is high or the amount of heating is large, since the surface tension decreases, the working fluid flows at a corresponding high speed so that the working fluid needed in the second moving space 213 may be quickly provided.

Figure 12A:
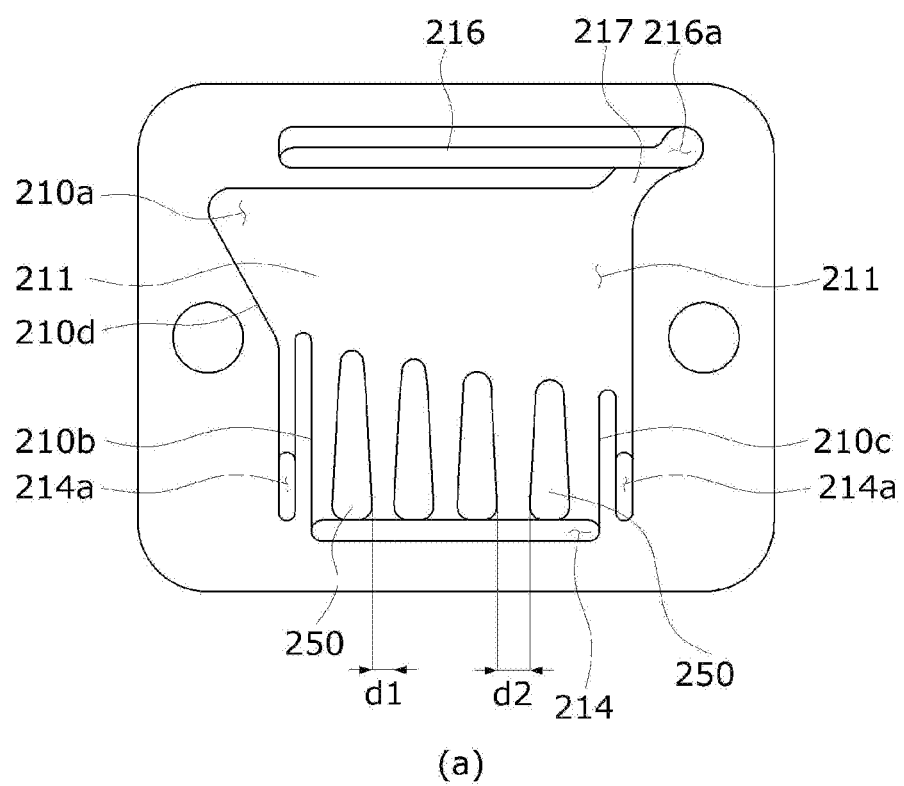
FIGS. 12A and 12B are views illustrating the embodiment of FIG. 11.
Figure 12B:
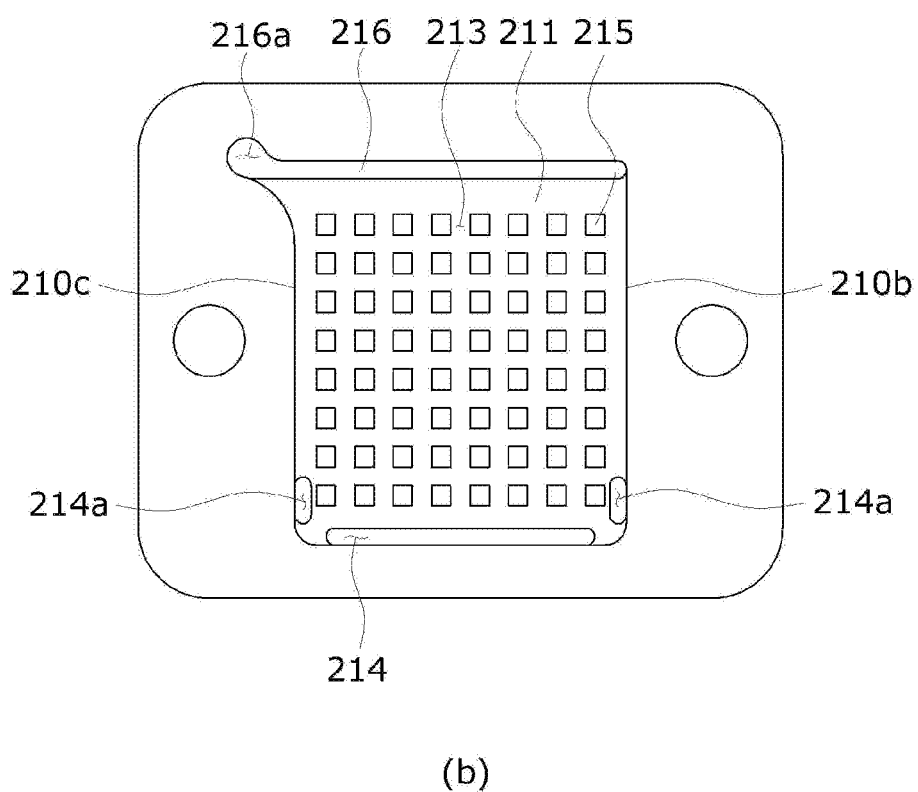

FIG. 12 is a set of views illustrating the embodiment of FIG. 11.

Referring to FIG. 12, at least one of the intervals between the adjacent flow guides 250 among the plurality of provided flow guides 250 may be disposed to be different from the remaining intervals.

Shortest distances between the adjacent flow guides 250 may be formed to be different. In this case, the adjacent intervals may be formed to be different and may be different according to a ratio at which the flow guides 250 are disposed. The interval between the flow guides 250 may be set to increase in a direction away from the inlet portion 210a.

In addition, in this case, the interval between the flow guides 250 may be set according to a distance between the flow guide 250 and the first inner wall 210b As an embodiment, an interval d2 between the adjacent flow guides 250 disposed at an outermost position may be greater than another interval d1. By adjusting the intervals of the flow guides 250, heat of the working fluid is uniformly distributed. As a distance through which the working fluid moves in a heat transfer area increases, the working fluid easily enters a state in which the working fluid is easily boiled and overheated. Therefore, a substantially uniform state of the working fluid may be achieved by increasing an amount of working fluid flowing between the flow guides 250, and thus there is an effect of preventing drying-out.

In addition, one or more auxiliary moving passages 214a may be provided in the partition wall 211.

The auxiliary moving passage 214a may supplement a required amount of the working fluid in a case in which an attachment member of the cooling apparatus is changed and the working fluid does not flow in a main passage.

As an embodiment, the auxiliary moving passages 214a may be provided as a pair and disposed at outer sides of the first moving passage 214.

As shown in FIG. 12, the auxiliary moving passage 214a may pass through the partition wall 211 and connect the first moving space 212 and the second moving space 213 to form a passage through which the working fluid is moveable. In this case, the auxiliary moving passage 214a may be formed to have another size according to an amount of a required working fluid.

As an embodiment, the auxiliary moving passages 214a may be formed in passages formed to be spaced apart from the first inner wall 210b and the second inner wall 210c.

As described above, the embodiments of the present invention have been described with reference to the accompanying drawings.

The above description is only an example describing a technological scope of the present invention. Various changes, modifications, and replacements may be made by those skilled in the art without departing from the spirit and scope of the present invention. Therefore, the embodiments disclosed above and in the accompanying drawings should be considered in a descriptive sense only and not to limit the technological scope. The technological scope of the present invention is not limited by the embodiments and the accompanying drawings. The scope of the present invention should be interpreted by the appended claims and encompass all equivalents falling within the scope of the appended claims.

[Reference Numerals]

| | |
|---|---|
| 1: COOLING APPARATUS | 100: CONDENSATION UNIT |
| 110: FIRST PIPE | 120: SECOND PIPE |
| 200: VAPORIZATION UNIT | 210: MAIN BODY PORTION |
| 210A: INLET PORTION | 210B: FIRST INNER WALL |
| 210C: SECOND INNER WALL | 210D: INCLINED SURFACE |
| 211: PARTITION WALL | 212: FIRST MOVING SPACE |
| 213: SECOND MOVING SPACE | 214: FIRST MOVING PASSAGE |
| 214A: AUXILIARY MOVING PASSAGE | |
| 215: PROTRUSION | |
| 216: SECOND MOVING PASSAGE | 216A: OUTLET PORTION |
| 217: THIRD MOVING PASSAGE | 218: GUIDE PORTION |
| 219: PARTITION PORTION | 219A: PROTRUDING STEP |
| 230: FIRST OUTER WALL | 231: FIRST CONNECTION HOLE |
| 232: SECOND CONNECTION HOLE | |
| 240: SECOND OUTER WALL | 250: FLOW GUIDE |

The invention claimed is:

1. A cooling apparatus comprising:
a vaporization unit in which a working fluid evaporates due to a heat source; and
a condensation unit in which the evaporated working fluid is condensed,
wherein the vaporization unit is divided into a first moving space and a second moving space by a partition wall,
a first moving passage connecting the first moving space and the second moving space is formed in one region of the partition wall, and
the working fluid introduced through the first moving space moves to the second moving space through the first moving passage to exchange heat,
wherein the first moving passage is formed under the partition wall,
wherein a second moving passage is provided above the second moving space; and
the second moving passage is blocked from the first moving space by a partition portion.

2. The cooling apparatus of claim 1, wherein the vaporization unit includes:
a main body portion divided into the first moving space and the second moving space by the partition wall;
a first outer wall sealing the first moving space; and
a second outer wall sealing the second moving space.

3. The cooling apparatus of claim 2, wherein a plurality of protrusions are formed on the partition wall of the second moving space to increase a heat exchange area.

4. The cooling apparatus of claim 3, wherein the plurality of protrusions are in surface contact with the second outer wall.

5. The cooling apparatus of claim 2, further comprising:
a first pipe through which the working fluid moves from the condensation unit to the vaporization unit; and
a second pipe through which the working fluid evaporated in the vaporization unit flows to the condensation unit,
wherein an inlet portion recessed inward is disposed at an upper side of a first inner wall of the first moving space, and
the inlet portion is connected to the first pipe, and the working fluid is introduced through the inlet portion.

6. The cooling apparatus of claim 2, wherein a third moving passage connecting the second moving passage and the first moving space is disposed at an upper side of a second inner wall facing a first inner wall of the first moving space.

7. The cooling apparatus of claim 6, wherein a guide portion which guides bubbles introduced through the first moving passage to the third moving passage is disposed in the first moving space.

8. The cooling apparatus of claim 5, wherein both of the first pipe and the second pipe are connected to the first outer wall or a side surface of the main body portion.

9. The cooling apparatus of claim 5, wherein:
the first pipe is connected to a lower portion of the condensation unit; and
the second pipe is connected to an upper portion of the condensation unit.

10. The cooling apparatus of claim 1, wherein a protruding step is formed in one region of the partition portion.

11. The cooling apparatus of claim 1, wherein at least one flow guide is disposed in the first moving space.

12. The cooling apparatus of claim 11, wherein:
the flow guide is provided as a plurality of flow guides; and
a height of the flow guide decreases in a direction away from an inlet portion thorough which the working fluid is introduced from the vaporization unit.

13. The cooling apparatus of claim 11, wherein an upper portion of the flow guide is formed to have a curved surface.

14. The cooling apparatus of claim 11, wherein the flow guide includes a section in which a width of the flow guide increases in a direction from an upper portion toward a lower portion of the flow guide.

15. The cooling apparatus of claim 12, wherein at least one interval among intervals between the adjacent flow guides is disposed to be different from the remaining intervals.

16. The cooling apparatus of claim 1, wherein:
an inlet portion recessed inward is disposed in the first moving space; and
the inlet portion includes an inclined surface formed toward the first moving passage.

17. The cooling apparatus of claim 1, wherein at least one auxiliary moving passage is provided on the partition wall.

* * * * *